Figures 1, 2:
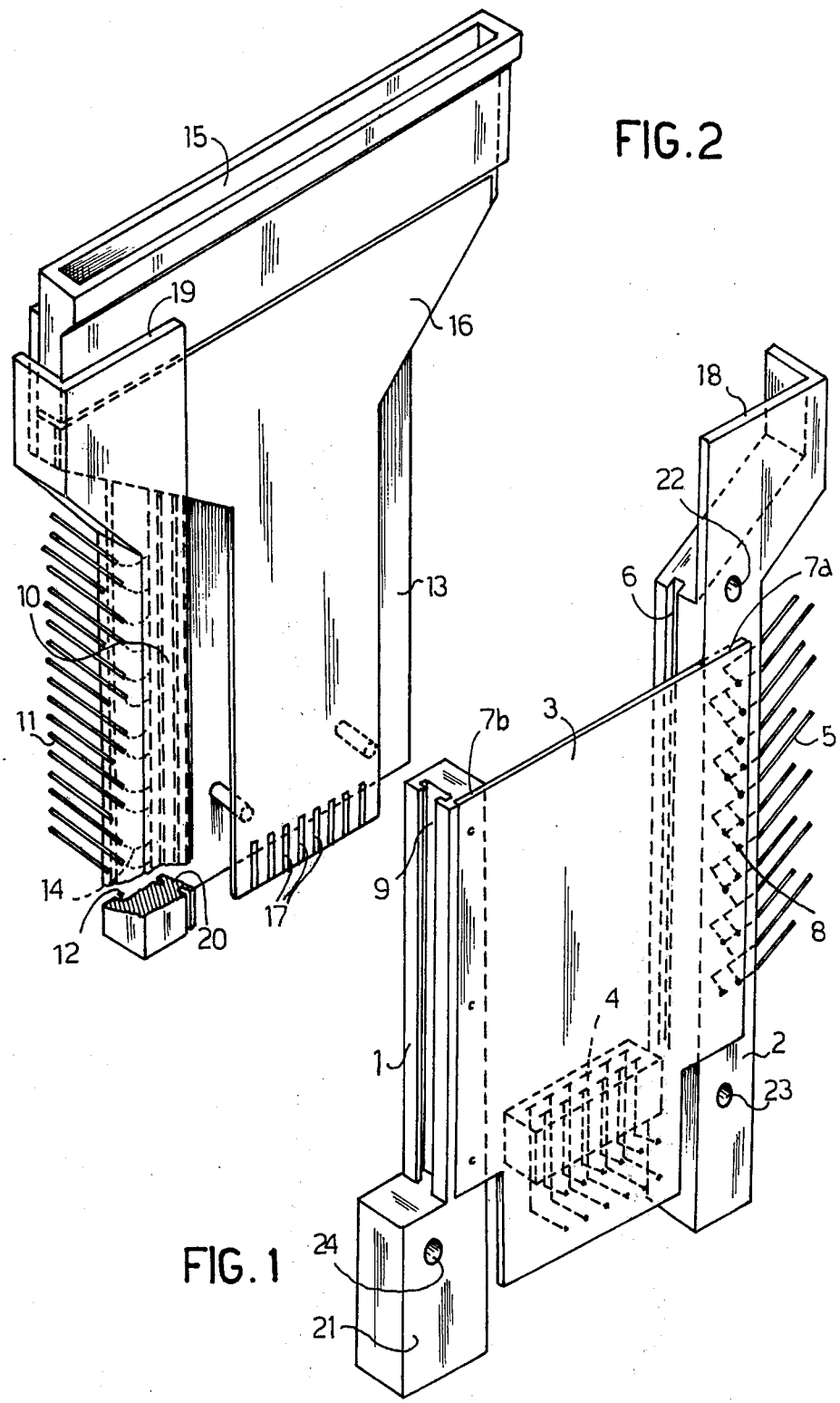

United States Patent [19]

Valfré

[11] 4,017,768
[45] Apr. 12, 1977

[54] CONNECTING DEVICE FOR TELECOMMUNICATION CIRCUITS, PARTICULARLY FOR THE SECTIONING THEREOF

[76] Inventor: Cesare Valfré, Via Borgosesia 46 bis, Turin, Italy

[22] Filed: Nov. 7, 1975

[21] Appl. No.: 627,031

[30] Foreign Application Priority Data

Dec. 23, 1974 Italy .................................. 70731/74

[52] U.S. Cl. ............................ 361/399; 339/17 M; 361/415; 361/421
[51] Int. Cl.² ........................................ H05K 7/14
[58] Field of Search .......... 317/118, 101 D, 101 H; 339/19 L, 19 LC, 19 LM, 19 M, 19 N

[56] References Cited

UNITED STATES PATENTS

| 3,333,156 | 7/1967 | Weisman | 339/17 M |
| 3,736,471 | 5/1973 | Donze | 317/101 D |

Primary Examiner—Gerald P. Tolin

[57] ABSTRACT

The invention concerns a device for connecting and sectioning telecommunication circuits, made of a fixed part and an insertable and disinsertable part, both parts carrying printed circuits coupled to each other by means of connectors and being provided with a set of conductors for connecting the device to incoming and departing leads.

4 Claims, 2 Drawing Figures

U.S. Patent
April 12, 1977
4,017,768

CONNECTING DEVICE FOR TELECOMMUNICATION CIRCUITS, PARTICULARLY FOR THE SECTIONING THEREOF

The present invention relates to a connecting device for telecommunication circuits, particularly for the sectioning thereof.

It is known that in the practical exploitation of telecommunication networks, for a correct use of the signals present on the circuit it is necessary to submit them to particular treatments or processings, such as for instance amplifications, attenuations, equalizations, checks, protections, decodings, sectionings or the like, which are carried out through suitable electric and/or electronic components.

The object of this invention is to provide a device allowing to connect input circuits with output circuits through one or more circuit able to carry out one or more of said processings.

Hereinafter the term "input" will denote the circuit or circuits carrying the signals to be processed, and the term "output" will denote the circuit or circuits carrying the signals already processed.

The device according to the invention comprises two parts which can be coupled with each other, the first part comprises two parallel rods, of different lengths, connected by a substantially rectangular printed circuit provided with a connector, the longer rod being provided, on its outer face, with input terminals and, on the opposed face, with a groove extending over the greatest part of its length; a face of said rods, parallel to the printed circuit, having a hollow able to house one of two opposed edges of the printed circuit and, on the longer rod, the inner ends of the input terminals, and the other face of the shorter rod having a longitudinal groove with a double retaining edge; the second part of the device being formed by a single side rod, externally provided with output terminals and having a hollow able to house one edge of a second, cantilevered printed circuit and the inner ends of the output terminals, one end portion of the second printed circuit being jointed with a connector to which is joined a third printed circuit, which is kept parallel to the second one and has at the opposed end the contacts able to engage the connector of the said first part, the second and third printed circuits bearing all components able to carry out all aforesaid processings and treatments on the incoming signals.

Preferably the longer rod in the first part extends, past the free end of the first printed circuit, into a L-shaped appendage which is symmetrical with a similar appendage realized at one end of the rod of the second part, said two appendages forming a seat able to house the second connector; moreover in the first part the shorter rod has a larger end portion acting as a stop for the third rod when a longitudinal tongue of this rod fits into the groove of the shorter rod.

Advantageously the device according to the invention can be joined with a plurality of other similar devices; to this end the first part, in correspondence with the two rods, has through holes with axis perpendicular to the plan of the printed circuits, which holes can be engaged by suitable bars able to connect said plurality of devices.

Other characteristics and features of the invention will clearly result from the following description, with reference to the accompanying drawings which show a preferred embodiment of the invention.

In the drawings:

FIG. 1 is a diagrammatical perspective view of the first part of the device, and FIG. 2 is a perspective view of the second part.

According to FIG. 1, the first part of the device, which may be considered as a fixed part, comprises a short rod 1 and a long rod 2, parallel to the short one and connected thereto by a printed circuit 3 having a connector 4; the long rod 2 has on its outer face a plurality of input terminals 5 and on the inner face a groove 6 extending over the greatest part of its length.

A face of said rods, parallel with the printed circuit 3, has a hollow 7a and respectively 7b able to house one of two opposed edges of the printed circuit 3.

Moreover the hollow on rod 2 also houses the inner ends 8 of the input terminals 5. The outer face of rod 1, has a longitudinal groove 9 with a double edge.

The second part of the device (FIG. 2), which may be considered as a disinsertable part, comprises a single side rod 10, externally provided with output terminals 11 and having a groove 12 apt to house one edge of a second, cantilevered printed circuit 13 and the inner ends 14 of the output terminals 11.

One end of the printed circuit 13 (at the top in FIG. 2) has joined thereto a connector 15 to which a third printed circuit 16 is connected. This third circuit is kept parallel to the second one and at the opposed end is provided with contacts 17 able to engage the connector 4.

The printed circuits 13 and 16 bear the components able to carry out the required processings and treatments.

FIG. 1 shows that the rod 2 in its upper portion extends into a cantilevered, L-shaped appendage 18 which is symmetrical with an appendage 19 on rod 10. When the disinsertable part is fitted on the fixed part, the two appendages 18 and 19 form a kind of niche adapted to house the connector 15.

The rod 10 has on its inner face a tongue 20, of which the shape is conjugate with that of groove 9.

It is still to be noted that the rod 1 has at one end (at the bottom in FIG. 1) an enlarged end portion 21 which acts as a stop when the tongue 20 engages the groove 9.

The rods 1 and 2 have through holes 22, 23, 24 where bars may be inserted in order to block in their positions a plurality of devices according to the invention.

In the practical use the disinsertable part is inserted in the fixed part and is caused to slide so that the tongue 20 engages groove 9, the edge of the printed circuits 13 engages groove 6 and contacts 17 the connector 4.

Thus a simple and robust assembly is obtained having a minimum encumbrance and allowing to connect a high number of circuits in the desired way.

It is self evident that changes and modifications may be made in the practice in the described embodiment, without departing from the scope of the invention.

What I claim is:

1. A connecting device for telecommunication circuits, more particularly for the sectioning thereof, characterized in that it comprises two parts which may be coupled with each other, of which the first consists of two parallel rods, of different lengths, connected by a substantially rectangular printed circuit provided with a connector, the longer rod having on its outer face input terminals and on the opposed face a groove extending over the greatest part of its length; a face of said rods, parallel with the printed circuit, having a hollow able to house one of two opposed edges of the printed circuit and, on the longer rod, the inner ends of the input terminals; the outer face of the shorter rod having a longitudinal groove with double edge; the second part of the device being formed by a single side rod, externally provided with output terminals and having a hollow able to house an edge of a second, cantilevered printed circuit and the inner ends of the output terminals, one end of the second printed circuit being connected to a connector to which a third printed circuit is joined, said third circuit being kept parallel with the second one and being provided at the opposed end with the contacts able to engage the connector of the said first part, whereas the second and third printed circuits bear the components apt to carry out on the incoming signals the desired processings and treatments.

2. A device according to claim 1, characterized in that said longer rod extends past the free end of the first printed circuit into a L-shaped appendage symmetrical with a similar appendage realized at one end of the rod of said second part, the two appendages forming a niche able to house the second connector.

3. A device according to claim 1, characterized in that said shorter rod has an enlarged end portion acting as a stop for the rod of the second part, which is provided with a longitudinal tongue conjugate with the groove of said shorter rod.

4. A device according to claim 1, characterized in that said rods of the first part have through holes for the mechanical connection of a plurality of devices.

* * * * *